United States Patent
Sunwoo et al.

(10) Patent No.: US 11,894,863 B2
(45) Date of Patent: Feb. 6, 2024

(54) METHOD AND APPARATUS FOR GENERATING A DECODING POSITION CONTROL SIGNAL FOR DECODING USING POLAR CODES

(71) Applicant: AJOU UNIVERSITY INDUSTRY-ACADEMIC COOPERATION FOUNDATION, Suwon-si (KR)

(72) Inventors: Myung Hoon Sunwoo, Seoul (KR); U Seok Lee, Suwon-si (KR)

(73) Assignee: AJOU UNIVERSITY INDUSTRY-ACADEMIC COOPERATION FOUNDATION, Suwon-si (KR)

( * ) Notice: Subject to any disclaimer, the term of this patent is extended or adjusted under 35 U.S.C. 154(b) by 0 days.

(21) Appl. No.: 17/884,935

(22) Filed: Aug. 10, 2022

(65) Prior Publication Data

US 2023/0084339 A1 Mar. 16, 2023

(30) Foreign Application Priority Data

Sep. 16, 2021 (KR) .......... 10-2021-0124141

(51) Int. Cl.
*H03M 13/00* (2006.01)
*H03M 13/11* (2006.01)
*G06F 7/501* (2006.01)

(52) U.S. Cl.
CPC ... *H03M 13/6572* (2013.01); *H03M 13/1108* (2013.01); *G06F 7/501* (2013.01)

(58) Field of Classification Search
CPC .............. H03M 13/6572; H03M 13/1108
See application file for complete search history.

(56) References Cited

U.S. PATENT DOCUMENTS

2017/0366204 A1* 12/2017 Shi .............. H04L 25/061
2022/0149868 A1* 5/2022 Wang ............ H03M 13/6572

FOREIGN PATENT DOCUMENTS

KR 10-1817168 B1 1/2018

OTHER PUBLICATIONS

Y. Yongrun, P. Zhiwen, L. Nan and Y. Xiaohu, "Successive Cancellation List Bit-flip Decoder for Polar Codes," 2018 10th International Conference on Wireless Communications and Signal Processing (WCSP), Hangzhou, China, 2018, pp. 1-6, doi: 10.1109/WCSP.2018.8555688. (Year: 2018).*

* cited by examiner

*Primary Examiner* — Joseph D Torres
(74) *Attorney, Agent, or Firm* — Sughrue Mion, PLLC (57) ABSTRACT

Disclosed are a method and apparatus for generating a decoding position control signal for decoding using polar codes. The method and apparatus for generating a decoding position control signal for decoding using polar codes according to an embodiment of the present disclosure include generating a decoding tree obtained by forming a plurality of nodes in a hierarchical structure for a polar-encoded codeword, decoding the codeword using a successive cancellation (SC) decoding technique, and generating control signal through a preset operation relationship based on a position of a bit returned during re-decoding among the decoded codeword.

10 Claims, 4 Drawing Sheets

METHOD AND APPARATUS FOR GENERATING A DECODING POSITION CONTROL SIGNAL FOR DECODING USING POLAR CODES

CROSS-REFERENCE TO RELATED APPLICATION

This application claims the benefit under 35 USC § 119(a) of Korean Patent Application No. 10-2021-0124141, filed on Sep. 16, 2021, in the Korean Intellectual Property Office, the entire disclosure of which is incorporated herein by reference for all purposes.

BACKGROUND

1. Field

Embodiments of the present disclosure relate to a technology for generating a decoding position control signal for decoding using polar codes.

2. Description of Related Art

The polar code is the first error correction code that can achieve a channel capacity in a discrete memoryless channel. Decoding algorithms for the polar code is largely divided into a successive cancellation (SC)-based algorithm and a belief propagation (BP)-based algorithm. Research on the SC-based decoding algorithm that achieves higher error correction performance compared to the BP-based algorithm is being actively conducted. In particular, the polar code has been recognized for its excellence and has been adopted as a channel code for the 5G standard, and research on the polar code is being actively conducted. The polar code has an advantage of showing low complexity in encoding and decoding, but the successive-cancellation (SC) (hereinafter referred to as SC) decoding, which is the most basic decoding scheme for the polar code, has lower error correction performance compared to the SC decoding for the low-density parity-check (LDPC) code and the turbo code, which are other error correction codes currently used.

In order to solve this shortcoming, supplementary decoding schemes based on the SC decoding scheme have been proposed, and one of them is a successive cancellation flip (SCF) (hereinafter, SCF) decoding scheme. This SCF decoding scheme is performed through a bit-flipping algorithm that changes a value of a bit, which has a high probability of error due to low reliability, of a codeword. A cyclic redundancy check (CRC) (hereinafter referred to as CRC) code is additionally used. to determine whether or not the corresponding process is in progress.

The SCF decoding process is as follows. When primary decoding using a conventional SC decoding scheme is completed, error detection is performed through the CRC code. In this case, if an error is not detected, decoding is terminated. If an error is detected, the SCF decoding process returns to a position of the bit having the lowest log-likelihood ratio (LLR) (hereinafter, LLR) value and flips the corresponding bit. After that, re-decoding is performed at the corresponding position, and CRC detection is performed again when the re-decoding is completed. Even if bit flipping is performed, if an error is detected again in the secondary CRC detection, the SCF decoding process flips the bit having the second LLR minimum value and returns to the corresponding position. This process is repeated up to T times.

Although the SCF decoding scheme has improved low error correction performance of the conventional SC decoding method, memory usage is greatly increased when implemented by hardware. In the SC decoding scheme, the codeword is sequentially decoded bit by bit, and information such as LLR and subtotal at the previous bit position is used when decoding the next bit. The SCF decoder based on this SC decoding scheme has to store information at the corresponding position up to T times due to the process by which the SCF decoder returns to the previous bit when an error is detected. Accordingly, an additional memory is required to store pieces of information at the corresponding positions, and thus the memory usage and power consumption of the entire decoder increase. In order to solve the hardware implementation problem of the SCF decoder, there is a need for a memory reduction technique through an efficient decoder structure.

PRIOR ART LITERATURE

Patent Literature

PTL 1: Korea Patent Publication No. 10-1817168 (Registered on Jan. 4, 2018)

SUMMARY

Embodiments of the present disclosure are to provide a method and apparatus for generating a decoding position control signal for decoding using polar codes.

According to an exemplary embodiment of the present disclosure, there is provided a method for generating a decoding position control signal for decoding using polar codes, including generating a decoding tree obtained by forming a plurality of nodes in a hierarchical structure for a polar-encoded codeword, decoding the codeword using a successive cancellation (SC) decoding technique, and generating control signal through a preset operation relationship based on a position of a bit returned during re-decoding among the decoded codeword.

In the decoding of the codeword, nodes of the lowest stage may be sequentially decoded one by one by searching the nodes of the lowest stage from a node of the highest stage in the decoding tree in a depth-first search (DFS) method.

In the generating of the control signal, the control signal may be generated based on a first bit string indicating the position of the bit returned during the re-decoding, and a second bit string calculated through the preset operation relationship with the first bit string.

The first bit string and the second bit string may be expressed in a binary system having a $\log_2 N$ number of bit places (where N is a codeword length of the codeword.

In the preset operation relationship, the second bit string may be output by adding the first bit string and 2's complement of 1 using an adder, and perform an exclusive-OR operation of the first bit string and a result of the addition using an exclusive-OR (XOR) operator.

The generating of the control signal may further include generating clock cycle information required to decode the bit returned during the re-decoding through the number of is in all bit places in the second bit string, generating stage information in which an operation to be performed through a bit place value of the second bit string, and generating operation information performed through the stage information through a bit place value of the first bit string.

In the generating of the stage information, it may be checked whether or not the operation is to be performed in a j-th stage of the decoding tree through a j-th bit place of the second bit string, and when a j-th bit place value of the second bit string is 1, it may be determined that the operation is to be performed in the j-th stage of the decoding tree (where j is from ($\log_2 N-1$) to 0 in descending order from left).

In the generating of the operation information, the operation to be performed in the j-th stage in which the operation is determined to be performed may be checked through a j-th bit place of the first bit string, and if a j-th bit place value of the first bit string is 0, the operation to be performed in the j-th stage may be determined as an f operation, and if the j-th bit place value of the first bit string is 1, the operation to be performed in the j-th stage may be determined as a g operation.

According to another exemplary embodiment of the present disclosure, there is provided an apparatus for generating a decoding position control signal for decoding using polar codes, including a decoding tree generator that generates a decoding tree obtained by forming a plurality of nodes in a hierarchical structure for a polar-encoded codeword, a decoder that decodes the codeword using a successive cancellation (SC) decoding technique, and a control signal generator that generates a control signal through a preset operation relationship based on a position of a bit returned during re-decoding among the decoded codeword.

The decoder may sequentially decode nodes of the lowest stage one by one by searching the nodes of the lowest stage from a node of the highest stage in the decoding tree in a depth-first search (DFS) method.

The control signal generator may generate the control signal based on a first bit string indicating the position of the bit returned during the re-decoding, and a second bit string calculated through the preset operation relationship with the first bit string.

The first bit string and the second bit string may be expressed in a binary system having a $\log_2 N$ number of bit places (where N is a codeword length of the codeword).

In the preset operation relationship, the second bit string may be output by adding the first bit string and 2's complement of 1 using an adder, and perform an exclusive-OR operation of the first bit string and a result of the addition using an exclusive-OR (XOR) operator.

The control signal generator may generate clock cycle information required to decode the bit returned during the re-decoding through the number of 1s in all bit places in the second bit string, generate stage information in which an operation to be performed through a bit place value of the second bit string, and generate operation information to be performed through the stage information through a bit place value of the first bit string.

The control signal generator may check whether or not the operation is to be performed in a j-th stage of the decoding tree through a j-th bit place of the second bit string, and may generate the stage information by determining that the operation is to be performed in the j-th stage of the decoding tree when a j-th bit place value of the second bit string is 1 (where j is from ($\log_2 N-1$) to 0 in descending order from left).

The control signal generator may check the operation to be performed in the j-th stage in which the operation is determined to be performed through a j-th bit place of the first bit string, and may generate the stage information by determining that the operation to be performed in the j-th stage as an f operation if a j-th bit place value of the first bit string is 0, and determining that the operation to be performed in the j-th stage as a g operation if the j-th bit place value of the first bit string is 1.

According to the embodiments of the present disclosure, by using the position of the decoding bit and the preset operation relationship, it is possible to reduce an amount of memory required for decoding using the successive cancellation (SC) decoding method.

In addition, according to the embodiments of the present disclosure, by implementing it with a $\log_2 N$-bit adder and $\log_2 N$-bit XOR gate based on a binary representation of the bit position, it may be possible to design a fast circuit that is easy to implement in hardware and has a short structural path.

DETAILED DESCRIPTION

Hereinafter, a specific embodiment of the present disclosure will be described with reference to the drawings. The following detailed description is provided to aid in a comprehensive understanding of the methods, apparatus and/or systems described herein. However, this is illustrative only, and the present disclosure is not limited thereto.

In describing the embodiments of the present disclosure, when it is determined that a detailed description of related known technologies may unnecessarily obscure the subject matter of the present disclosure, a detailed description thereof will be omitted. In addition, terms to be described later are terms defined in consideration of functions in the present disclosure, which may vary according to the intention or custom of users or operators. Therefore, the definition should be made based on the contents throughout this specification. The terms used in the detailed description are only for describing embodiments of the present disclosure, and should not be limiting. Unless explicitly used otherwise, expressions in the singular form include the meaning of the plural form. In this description, expressions such as "comprising" or "including" are intended to refer to certain features, numbers, steps, actions, elements, some or combination thereof, and it is not to be construed to exclude the presence or possibility of one or more other features, numbers, steps, actions, elements, some or combinations thereof, other than those described.

Figure 1:
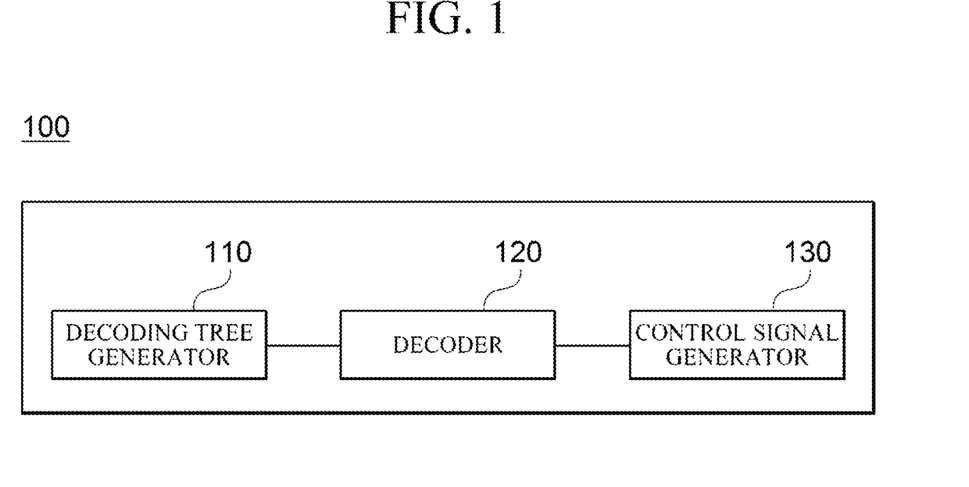
FIG. 1 is a block diagram illustrating an apparatus for generating a decoding position control signal according to an embodiment of the present disclosure.

FIG. 1 is a block diagram illustrating an apparatus 100 for generating a decoding position control signal according to an embodiment of the present disclosure.

Meanwhile, in the present disclosure, a polar code encoding and decoding device used in a communication system can be described as an example. The polar code encoding device may encode data (information bits) to be transmitted using the polar code, and transmit the encoded data (codeword) to the polar code decoding device through a channel. Here, the polar code is a code that achieves channel capacity by using a channel polarization phenomenon that occurs when several channels are combined and then properly separated. In addition, the polar code decoding device may decode the codeword received from the polar code encoding device through the channel based on a successive cancellation (SC) decoding technique, and estimate and output the data encoded by the polar code encoding device. In this case, according to the SC decoding technique, the encoded data is sequentially decoded bit by bit, and in decoding a certain bit, the decoded bit result before decoding is performed on the bit can be used. SCL (SClist) decoding, SCS (SC-stack) decoding, and SCF (SC-flip) decoding used to improve performance also basically use a sequential decoding method.

Referring to FIG. 1, the apparatus 100 for generating the decoding position control signal according to an embodiment may include a decoding tree generator 110, a decoder 120, and a control signal generator 130.

In the illustrated embodiment, configurations may respectively have different functions and capabilities other than those described below, and additional configurations may be included in addition to those described below.

In addition, in the following embodiments, the decoding tree generator 110, the decoder 120, and the control signal generator 130 may be implemented using one or more physically separated devices, or implemented by one or more processors or a combination of one or more processors and software, and may not be clearly distinguished in a specific operation unlike the illustrated example.

The decoding tree generator 110 may receive a polar encoded codeword and a codeword length to generate a decoding tree that satisfies the received codeword and codeword length. That is, the decoding tree generator 110 may form a plurality of nodes in a hierarchical structure for the polar encoded codeword.

Figure 2:
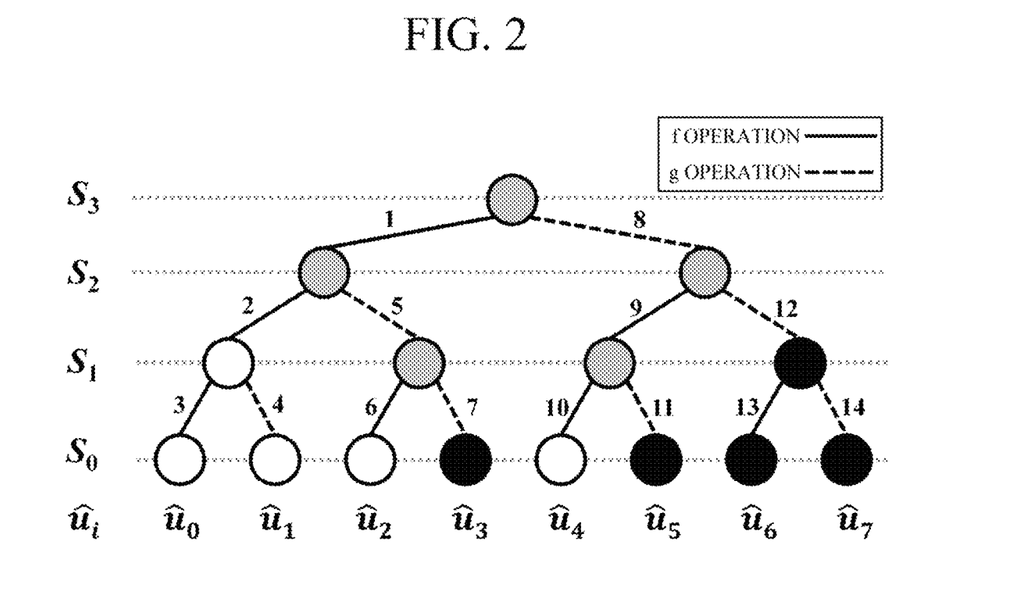
FIG. 2 is a diagram illustrating a decoding tree generated by the apparatus for generating the decoding position control signal according to an embodiment of the present disclosure.

FIG. 2 is a diagram illustrating a decoding tree generated by the apparatus 100 for generating the decoding position control signal according to an embodiment of the present disclosure.

Referring to FIG. 2, a binary tree structure of the polar encoded codeword when the total code length of the codeword is 8 bits and the information bits are 4 bits may be identified. Here, the left branch may represent an f operation, the right branch may represent a g operation, $S_i$ may represent a stage of the decoding tree, $\hat{U}_i$ may represent a decoded bit position, and the number indicated on a branch line may represent a clock cycle (CC) of a decoding schedule.

The decoding tree generator 110 may receive a codeword with a total codeword length N of 8 bits, of which 4 bits are information bits ($\hat{U}_3$, $\hat{U}_5$, $\hat{U}_6$, $\hat{U}_7$) and the remaining 4 bits are frozen bits) ($\hat{U}_0$, $\hat{U}_1$, $\hat{U}_2$, $\hat{U}_4$). In addition, the decoding tree generator 110 may generate a decoding tree that satisfies the received codeword as illustrated in FIG. 2.

The decoder 120 may decode the codeword using the SC decoding technique. That is, the decoder 120 may sequentially decode the entire received codeword bit by bit based on the SC decoding method.

Specifically, the decoder 120 may sequentially decode leaf nodes bit by bit by visiting or searching each leaf node (node of the lowest stage) from the root node (node of the highest stage) in the decoding tree in a depth-first search (DFS) method. Here, the highest stage may be $\log_2 N$, and the decoding schedule (clock cycle) may be (2N−2). For example, in the process of visiting each leaf node in the DFS method, the decoder 120 may calculate a log-likelihood ratio (LLR) value when visiting the left node (left branch) of the tree by the f operation, and calculate the LLR value when visiting the right node (right branch) of the tree by the g operation. Here, the f operation and the g operation are equations defined for calculating the LLR value in the SC decoding technique, and may be expressed as in Equation 1 below. Meanwhile, since the f operation and the g operation in the polar code decoding algorithm are well-known techniques, a detailed description thereof will be omitted.

$$f=\text{sign}(LLR_1)\text{sign}(LLR_2)\min(|LLR_1|,|LLR_2|)$$

$$g=LLR_2+(-1)^u LLR \quad\quad\quad [\text{Equation 1}]$$

As described above, by using the LLR values of the nodes indicated by the parent node by the DFS method visit in the decoding tree, the LLR values of the nodes indicated by the child nodes may be calculated by the f operation or the g operation depending on the position of the node.

The control signal generator 130 may generate control signal through a preset operation relationship based on the position of the bit returned during re-decoding. Specifically, the control signal generator 130 may generate a decoding position control signal by using a first bit string and a second bit string. Here, the first bit string may indicate a position of a bit returned during re-decoding. In addition, the second bit string may be obtained by performing an operation using the first bit string, an adder, and an exclusive-OR (XOR) operator. In addition, the control signal may be information on a type of operation for each stage performed for decoding a corresponding bit and clock cycle used in the corresponding bit.

Figure 3:
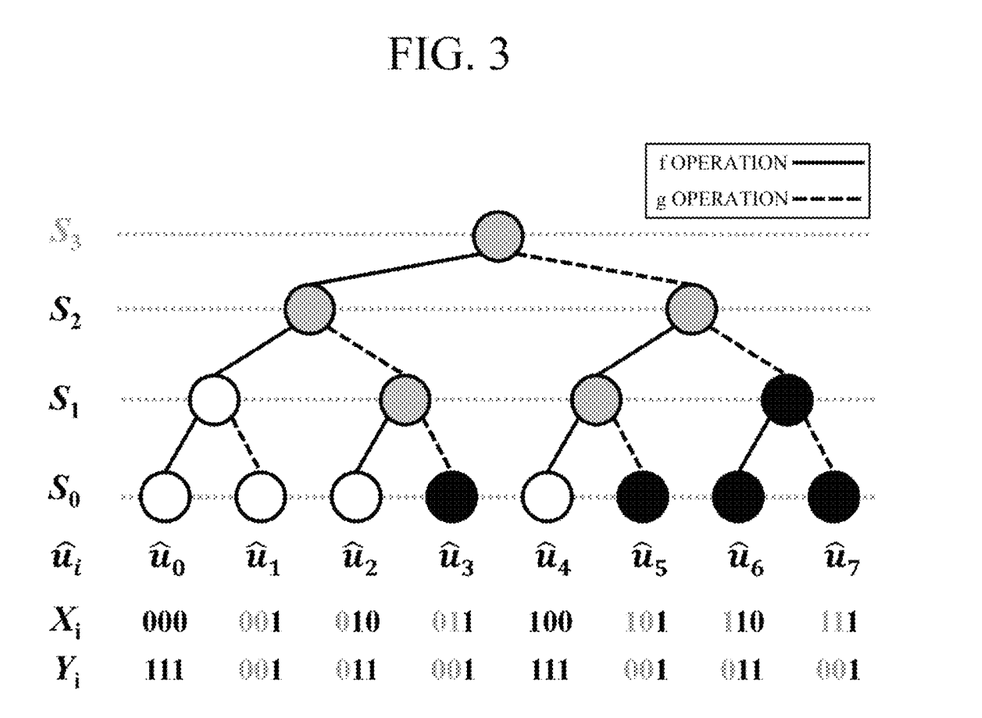
FIG. 3 is a diagram illustrating a process of generating a decoding position control signal based on a position of a bit in the apparatus for generating the decoding position control signal according to an embodiment of the present disclosure.

FIG. 3 is a diagram illustrating a process of generating a decoding position control signal based on a position of a bit in the apparatus 100 for generating the decoding position control signal according to an embodiment of the present disclosure.

Referring to FIG. 3, a first bit string $X_i$ indicating positions of bits based on a position of a bit returned during re-decoding, and a second bit string obtained by performing an operation using the first bit string $X_i$, an adder, and an XOR operator may be identified. Here, the length of the bit string may be determined according to the codeword length N of the codeword. For example, when the codeword length of the codeword is 8, the bit string may be a bit string having a bit string length of 3 as in the example illustrated in FIG. 3.

The first bit string $X_i$ may represent the position of the bit returned during re-decoding among the bits of the codeword in a binary system. For example, when a codeword length N of a codeword expressed as a decimal number is N bits, the position of the bit returned during re-decoding may be expressed as a bit string having a length of $\log_2 N$ bits.

As a specific example, when the bit to be re-decoded is the first bit $\hat{U}_0$ decoded based on the SC decoding method, the position of the corresponding bit represented by the first bit string at this time may be expressed as 000.

As another example, when the bit to be re-decoded is the sixth decoded bit $\hat{U}_5$ based on the SC decoding method, the position of the corresponding bit represented by the first bit string at this time may be represented by 101.

The second bit string $Y_i$ may be obtained by performing an operation using the first bit string $X_i$, an adder, and an XOR operator. That is, the second bit string $Y_i$ may be output by adding the first bit string and 2's complement of 1 by using the adder and performing an exclusive OR operation of the first bit string and the result obtained by performing addition of the first bit string and 2's complement of 1 using the XOR operator. For example, $Y_i$ may be obtained by calculating ($X_i-1$) from $X_i$ using an adder and by performing an XOR operation of $X_i$ and ($X_i-1$).

As a specific example, when the bit to be re-decoded is the first bit $\hat{U}_0$ decoded based on the SC decoding method, $X_i$ is 000 and ($X_i-1$) is 111 using 2's complement of 1 (111, which is 2's complement 001, is added to $X_i$), and the second bit string $Y_i$ obtained by performing an XOR operation of $X_i$ and ($X_i-1$) may be expressed as 111.

As another example, when the bit to be re-decoded is the sixth bit $\hat{U}_5$ decoded based on the SC decoding method, $X_i$ is 100 and ($X_i-1$) is 100 using 2's complement of 1 (111, which is 2's complement of 001, is added to $X_i$), and the second bit string Yi obtained by performing an XOR operation of $X_i$ and ($X_i-1$) may be expressed as 001.

The decoding position control signal may be generated using the first bit string and the second bit string. For example, clock cycle information required for decoding the bits to be re-decoded are generated through the number of 1s in all bit places in the second bit string, stage information $S_j$ on which an operation is to be performed may be generated through a bit place value of the second bit string, and operation information (f operation or g operation) to be performed may be generated from the corresponding stage information, through a bit place value of the first bit string. The apparatus 100 for generating the decoding position control signal may check whether an operation is to be performed in a j-th stage of the decoding tree through a j-the bit place of the second bit string through the stage information. When a j-th bit place value of the second bit string is 1, the apparatus 100 for generating the decoding position control signal may determine that the operation is to be performed in the j-th stage of the decoding tree. In addition, the apparatus 100 for generating the decoding position control signal may check the operation to be performed in the j-th stage, in which it is determined that the operation is to be performed through the j-th bit place of the first bit string, through the operation information. The decoding position control signal generating apparatus 100 may determine that the operation to be performed in the j-th stage is the f operation when a j-th bit place value of the first bit string is 0, and determine that the operation to be performed in the j-th stage is the g operation when the j-th bit place value of the first bit string is 1. Here, j may be expressed as ($\log_2 N-1$) to 0 in descending order from the left.

As a specific example, when $X_i$ is 000 and $Y_i$ is 111, since the number of 1s in all bit places in $Y_i$ is 3, it may be determined that a total of 3 clock cycles is required. In addition, since all of the bit place values of $Y_i$ are 1, it may be determined that the operation is to be performed in the stages $S_2$, $S_1$, and $S_0$ corresponding to respective bit place values. In addition, since the bit place values of $X_i$ corresponding to the stage $S_2$, $S_1$, and $S_0$ where the operation is to be performed are 0, respectively, it may be determined that the operation f is to be performed in each of the stages $S_2$, $S_1$, and $S_0$.

As another example, when $X_i$ is 101 and $Y_i$ is 001, since the number of is in all bit places in $Y_i$ is 1, it may be determined that a total of 1 clock cycle is required. In addition, since the bit place value of $Y_i$ is 1 only in the 0-th bit place, it may be determined that the operation is to be performed only in the stage $S_0$ corresponding to the corresponding bit place value. In addition, since the bit place value of $X_i$ corresponding to the stage $S_0$ in which the operation is to be performed is 1, it may be determined that the g operation is to be performed in the stage $S_0$.

The conventional control signal generator needs to consider three states for each stage of an initial state in which operations at all previous lower stages have been completed and the f operation is required, a state in which the f operation is completed and the g operation is required, and a state in which the g operation is completed and a lower stage operation is required, and requires a control signal state memory (2 bits per stage) for storing the three states for each stage and an initialization logic.

In contrast, the control signal generator 130 according to an embodiment may exhibits an effect of reducing an amount of additional memory required in the decoding process by using an adder and an exclusive-OR (XOR) operator based on the binary representation of the bit position.

Figure 4:
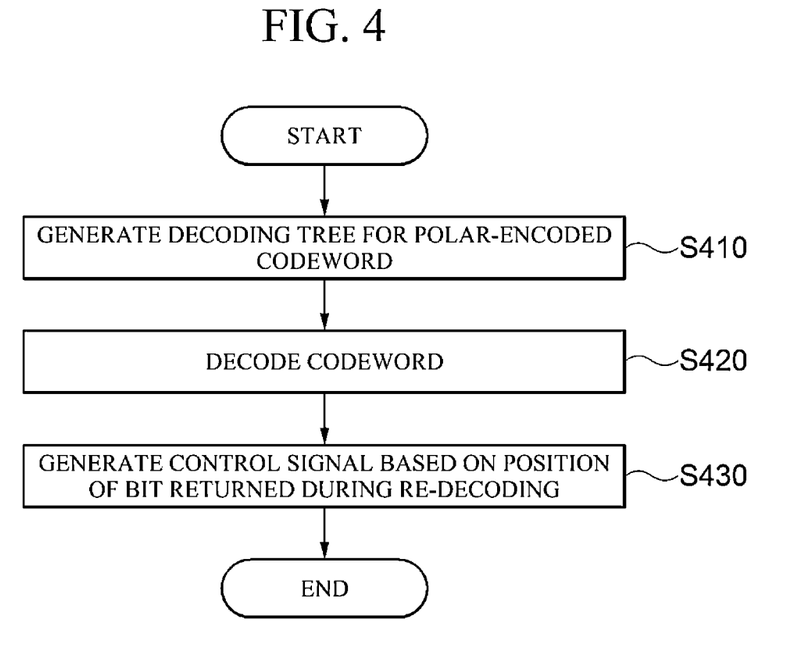
FIG. 4 is a flowchart illustrating a method of generating a decoding position control signal for decoding using polar codes according to an embodiment of the present disclosure.

FIG. 4 is a flowchart illustrating a method of generating a decoding position control signal for decoding using polar codes according to an embodiment of the present disclosure. The method illustrated in FIG. 4 may be performed by the apparatus 100 for generating the decoding position control signal illustrated in FIG. 1.

In the illustrated flowchart, although the method has been described by dividing the method into a plurality of steps, at least some steps may be performed in a different order, performed together in combination with other steps, omitted, performed by dividing the steps into sub-steps, or performed by being added with one or more steps (not illustrated).

Referring to FIG. 4, the apparatus 100 for generating the decoding position control signal receives a polar encoded codeword and a length of the codeword to generate a decoding tree that satisfies the received codeword and codeword length (S410).

After that, the apparatus 100 for generating the decoding position control signal decodes the codeword using the SC decoding technique (S420).

After that, the apparatus 100 for generating the decoding position control signal generates a control signal through a preset operation relationship based on the position of the bit returned during re-decoding (S430).

Figure 5:
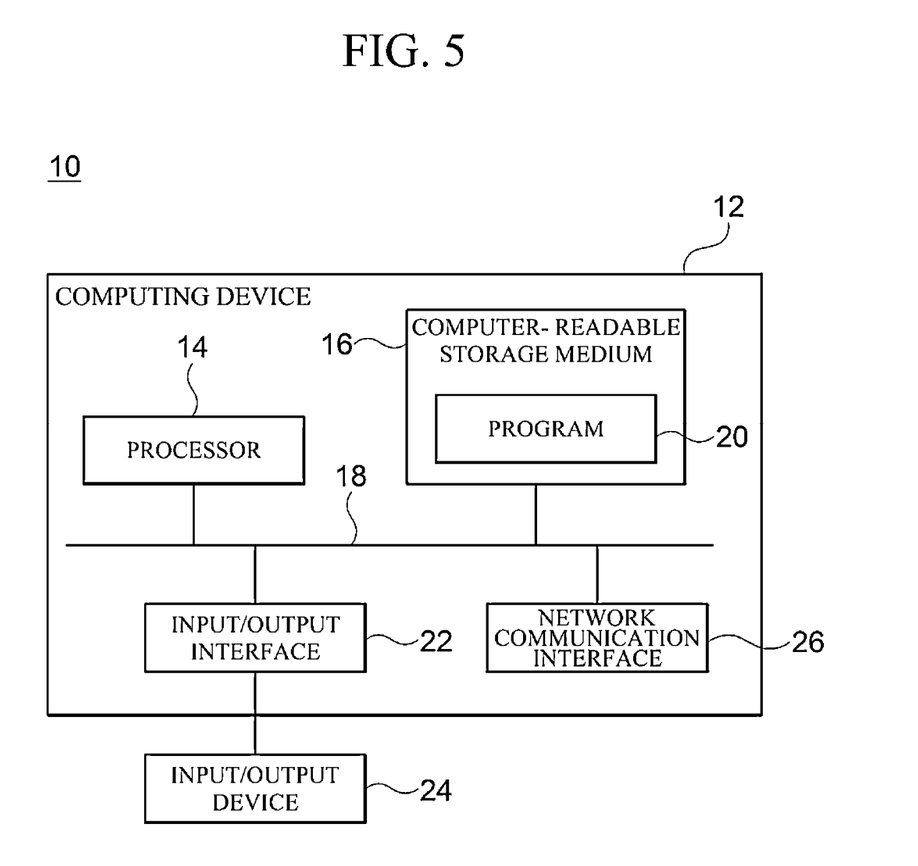
FIG. 5 is a block diagram illustratively describing a computing environment including a computing device according to an embodiment.

FIG. 5 is a block diagram illustratively describing a computing environment 10 including a computing device 12 according to an embodiment.

In the illustrated embodiment, respective components may have different functions and capabilities other than those described below, and may include additional components in addition to those described below.

The illustrated computing environment 10 includes the computing device 12. In an embodiment, the computing device 12 may be one or more components included in the apparatus 100 for generating the decoding position control signal.

The computing device 12 includes at least one processor 14, a computer-readable storage medium 16, and a communication bus 18. The processor 14 may cause the computing device 12 to operate according to the exemplary embodiment described above. For example, the processor 14 may execute one or more programs stored on the computer-readable storage medium 16. The one or more programs may include one or more computer-executable instructions, which, when executed by the processor 14, may be configured so that the computing device 12 performs operations according to the exemplary embodiment.

The computer-readable storage medium 16 is configured so that the computer-executable instruction or program code, program data, and/or other suitable forms of information are stored. A program 20 stored in the computer-readable storage medium 16 includes a set of instructions executable by the processor 14. In one embodiment, the computer-readable storage medium 16 may be a memory (volatile memory such as a random access memory, non-volatile memory, or any suitable combination thereof), one or more magnetic disk storage devices, optical disk storage devices, flash memory devices, other types of storage media that are accessible by the computing device 12 and capable of storing desired information, or any suitable combination thereof.

The communication bus 18 interconnects various other components of the computing device 12, including the processor 14 and the computer-readable storage medium 16.

The computing device 12 may also include one or more input/output interfaces 22 that provide an interface for one or more input/output devices 24, and one or more network communication interfaces 26. The input/output interface 22 and the network communication interface 26 are connected to the communication bus 18. The input/output device 24 may be connected to other components of the computing device 12 through the input/output interface 22. The exemplary input/output device 24 may include a pointing device (such as a mouse or trackpad), a keyboard, a touch input device (such as a touch pad or touch screen), a speech or sound input device, input devices such as various types of sensor devices and/or photographing devices, and/or output devices such as a display device, a printer, a speaker, and/or a network card. The exemplary input/output device 24 may be included inside the computing device 12 as a component constituting the computing device 12, or may be connected to the computing device 12 as a separate device distinct from the computing device 12.

Although representative embodiments of the present disclosure have been described in detail, a person skilled in the art to which the present disclosure pertains will understand that various modifications may be made thereto within the limits that do not depart from the scope of the present disclosure. Therefore, the scope of rights of the present disclosure should not be limited to the described embodiments, but should be defined not only by claims set forth below but also by equivalents to the claims.

What is claimed is:

1. A method for generating a decoding position control signal for decoding using polar codes by an apparatus for generating the decoding position control signal for decoding using the polar codes, the method comprising:
   generating a decoding tree obtained by forming a plurality of nodes in a hierarchical structure for a polar-encoded codeword;
   decoding the codeword using a successive cancellation (SC) decoding technique;
   generating a control signal through a preset operation relationship based on a position of a bit returned during re-decoding among the decoded codeword; and
   performing re-decoding at the position of the bit returned during re-decoding based on the control signal,
   wherein the generating of the control signal comprises generating the control signal based on a first bit string indicating the position of the bit returned during the re-decoding, and a second bit string calculated through the preset operation relationship with the first bit string,
   wherein the first bit string and the second bit string are expressed in a binary system having a $\log_2 N$ number of bit places (where N is a codeword length of the codeword),
   wherein the apparatus further includes an adder and an exclusive-OR (XOR) operator, and
   wherein in the preset operation relationship, the second bit string is output by adding the first bit string and 2's complement of 1 using the adder, and performing an exclusive-OR operation of the first bit string and a result of the addition using the XOR operator.

2. The method of claim 1, wherein
   in the decoding of the codeword, nodes of the lowest stage are sequentially decoded one by one by searching the nodes of the lowest stage from a node of the highest stage in the decoding tree in a depth-first search (DFS) method.

3. The method of claim 1, wherein
   the performing further includes:
   generating clock cycle information required to decode the bit returned during the re-decoding through the number of is in all bit places in the second bit string;
   generating stage information in which an operation to be performed through a bit place value of the second bit string; and
   generating operation information performed through the stage information through a bit place value of the first bit string.

4. The method of claim 3, wherein
   in the generating of the stage information,
   it is checked whether or not the operation is to be performed in a j-th stage of the decoding tree through a j-th bit place of the second bit string, and when a j-th bit place value of the second bit string is 1, it is determined that the operation is to be performed in the j-th stage of the decoding tree (where j is from ($\log_2 N-1$) to 0 in descending order from left).

5. The method of claim 4, wherein
   in the generating of the operation information,
   the operation to be performed in the j-th stage in which the operation is determined to be performed is checked through a j-th bit place of the first bit string, and if a bit place value of the first bit string is 0, the operation to be performed in the j-th stage is determined as an f operation, and if the j-th bit place value of the first bit string is 1, the operation to be performed in the j-th stage is determined as a g operation.

6. An apparatus for generating a decoding position control signal for decoding using polar codes, the apparatus comprising:
   a processor; and
   a memory storing instructions executable by the processor;
   wherein the processor is configured to:
   generate a decoding tree obtained by forming a plurality of nodes in a hierarchical structure for a polar-encoded codeword;
   decode the codeword using a successive cancellation (SC) decoding technique;
   generate a control signal through a preset operation relationship based on a position of a bit returned during re-decoding among the decoded codeword; and
   wherein the processor is further configured to:
   perform re-decoding at the position of the bit returned during re-decoding based on the control signal, and
   generate the control signal based on a first bit string indicating the position of the bit returned during the re-decoding, and a second bit string calculated through the preset operation relationship with the first bit string, wherein the first bit string and the second bit string are expressed in a binary system having a $\log_2 N$ number of bit places (where N is a codeword length of the codeword), wherein the apparatus further comprises an adder and an exclusive-OR (XOR) operator, and wherein in the preset operation relationship, the second bit string is output by adding the first bit string and 2's complement of 1 using the adder, and performing an exclusive-OR operation of the first bit string and a result of the addition using the XOR operator.

7. The apparatus of claim 6, wherein
the processor is further configured to sequentially decode nodes of the lowest stage one by one by searching the nodes of the lowest stage from a node of the highest stage in the decoding tree in a depth-first search (DFS) method.

8. The apparatus of claim 6, wherein
the processor is further configured to generate clock cycle information required to decode the bit returned during the re-decoding through the number of 1s in bit places in the second bit string, generate stage information (=information of a stage) in which an operation to be performed through a bit place value of the second bit string, and generate operation information to be performed through the stage information through a bit place value of the first bit string.

9. The apparatus of claim 8, wherein
the processor is further configured to check whether or not the operation is to be performed in a j-th stage of the decoding tree through a j-th bit place of the second bit string, and generate the stage information by determining that the operation is to be performed in the j-th stage of the decoding tree when a j-th bit place value of the second bit string is 1 (where j is from ($\log_2 N-1$) to 0 in descending order from left).

10. The apparatus of claim 9, wherein
the processor is further configured to check the operation to be performed in the j-th stage in which the operation is determined to be performed through a j-th bit place of the first bit string, and generate the stage information by determining that the operation to be performed in the j-th stage as an f operation if a bit place value of the first bit string is 0, and by determining that the operation to be performed in the j-th stage as a g operation if the j-th bit place value of the first bit string is 1.

* * * * *